US012632092B2

(12) United States Patent
Wu et al.

(10) Patent No.: US 12,632,092 B2
(45) Date of Patent: May 19, 2026

(54) FIXING ASSEMBLY, MOTHERBOARD HAVING THE FIXING ASSEMBLY, AND ELECTRONIC DEVICE HAVING THE MOTHERBOARD

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 137 days.

(21) Appl. No.: 18/821,735

(22) Filed: Aug. 30, 2024

(65) Prior Publication Data

US 2025/0138601 A1 May 1, 2025

(30) Foreign Application Priority Data

Oct. 30, 2023 (CN) .......................... 202311421748.4

(51) Int. Cl.
*G06F 1/183* (2026.01)
*H05K 7/14* (2006.01)

(52) U.S. Cl.
CPC .......... *G06F 1/183* (2013.01); *H05K 7/1402* (2013.01)

(58) Field of Classification Search
CPC .......... G06F 1/183; G06F 1/185; G06F 1/186; G06F 1/20; G06F 1/266; G06F 1/3203; G06F 1/3268; G06F 1/203; G06F 1/187;

H05K 7/1402; H05K 7/20509; H05K 7/20772; H05K 7/2039; H05K 7/203; H05K 7/1409; H05K 7/1431
See application file for complete search history.

(56) References Cited

U.S. PATENT DOCUMENTS

| | | | | |
|---|---|---|---|---|
| 7,684,197 | B2 * | 3/2010 | Zhu | H05K 7/2049 |
| | | | | 165/185 |
| 8,550,836 | B2 * | 10/2013 | Ma | G06F 1/185 |
| | | | | 439/328 |
| 10,031,563 | B2 * | 7/2018 | Cox | G06F 1/20 |
| 2010/0134982 | A1 * | 6/2010 | Meyer, IV | H10W 40/641 |
| | | | | 361/717 |
| 2011/0310563 | A1 * | 12/2011 | Meyer, IV | H10W 40/73 |
| | | | | 361/704 |
| 2014/0253156 | A1 * | 9/2014 | Lo | G01R 31/2875 |
| | | | | 324/750.05 |
| 2020/0159294 | A1 * | 5/2020 | Franz | G06F 1/20 |
| 2021/0259091 | A1 * | 8/2021 | Zirretta | H05K 1/0203 |
| 2022/0104396 | A1 * | 3/2022 | Chang | H05K 7/20272 |
| 2022/0172748 | A1 * | 6/2022 | Lu | G11C 5/04 |
| 2023/0026076 | A1 * | 1/2023 | Hu | H04W 72/23 |
| 2024/0237269 | A1 * | 7/2024 | Huang | H05K 7/20154 |

FOREIGN PATENT DOCUMENTS

| | | |
|---|---|---|
| CN | 207440242 U | 6/2018 |
| CN | 211859038 U | 11/2020 |

* cited by examiner

*Primary Examiner* — Abhishek M Rathod
(74) *Attorney, Agent, or Firm* — ScienBiziP, P.C.

(57) ABSTRACT

A fixing assembly includes a base with a receiving slot, a bracket rotatably connected to the base along its length direction, and a functional component on the bracket. The bracket has a resilient structure that deforms elastically and exerts a force toward the base when the bracket rotates away. The functional component contacts the memory module, and the receiving slot is for installing the memory module.

17 Claims, 12 Drawing Sheets

1

FIXING ASSEMBLY, MOTHERBOARD HAVING THE FIXING ASSEMBLY, AND ELECTRONIC DEVICE HAVING THE MOTHERBOARD

FIELD

The present application relates to the field of expansion modules, and more particularly to a fixing assembly, a motherboard having the fixing assembly, and an electronic device having the motherboard.

BACKGROUND

Memory modules, such as Dual-Inline-Memory-Modules (DIMM) include circuit boards equipped with memories, memory sticks, and graphics card adapters. To improve the performance of memory modules, a function component is needed to perform various operations such as temperature detection, heating, and cooling on the memory module. In related arts, the functional component is directly fixed to the memory module to perform the above operations.

However, the memory module may be needed to insert into or remove from a server in actual use. After the memory module is inserted into or removed from the server, the functional component needs to be fixed to the memory module again, which is inconvenient.

BRIEF DESCRIPTION OF THE DRAWINGS

Implementations of the present technology will now be described, by way of example only, with reference to the attached figures, wherein.

DETAILED DESCRIPTION

Figure 1:
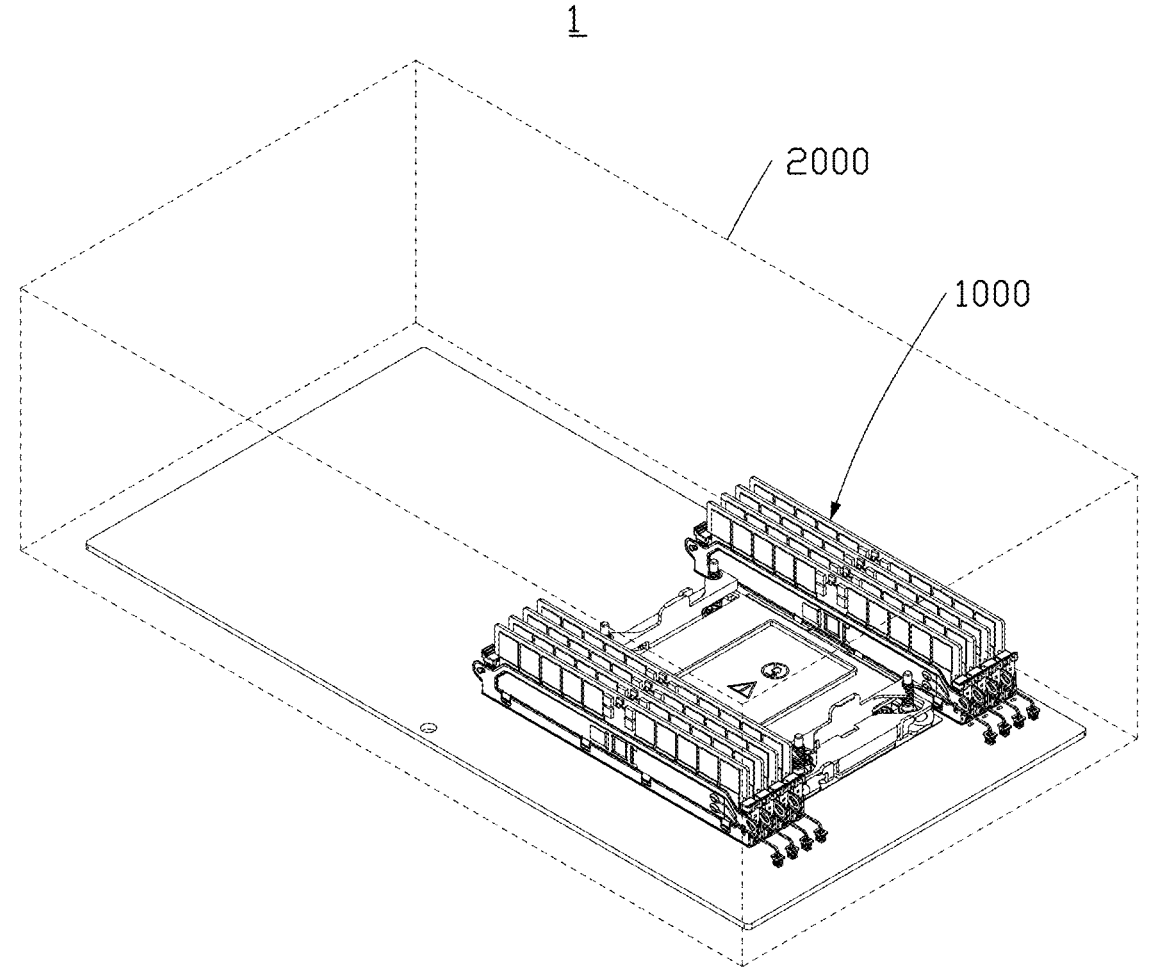
FIG. 1 is a diagrammatic view of an electronic device according to an embodiment of the present application.

It will be appreciated that for simplicity and clarity of illustration, where appropriate, reference numerals have been repeated among the different FIGS. to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Referring to FIG. 1, an electronic device 1 is provided according to an embodiment of the present application. The electronic device 1 includes at least one motherboard 1000 and a housing 2000, and each motherboard 1000 is disposed in the housing 2000. The electronic device 1 may include, but is not limited to, a computer host, a server, etc.

Figure 2:
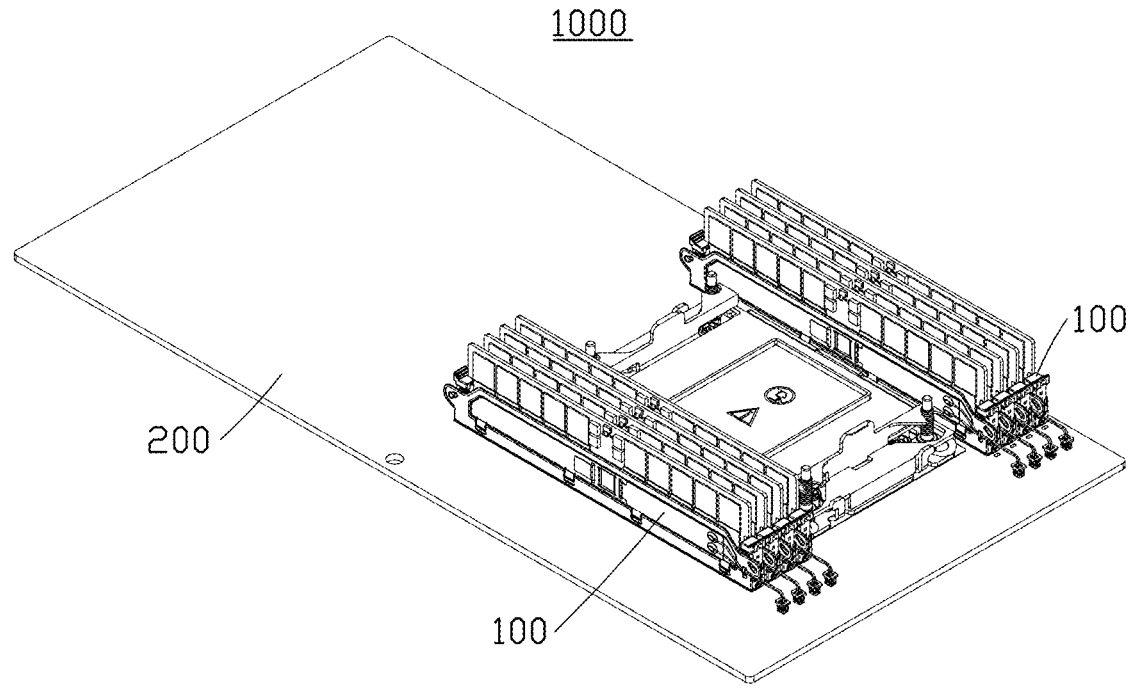
FIG. 2 is a diagrammatic view of a motherboard of the electronic device in FIG. 1.

Referring to FIG. 2, each motherboard 1000 includes a circuit board 200 and at least one fixing assembly 100 arranged on the circuit board 200. Each fixing assembly 100 is used to secure a memory module 300 thereon for storing data. In this embodiment, each motherboard 1000 includes multiple fixing assemblies 100.

Figure 3:
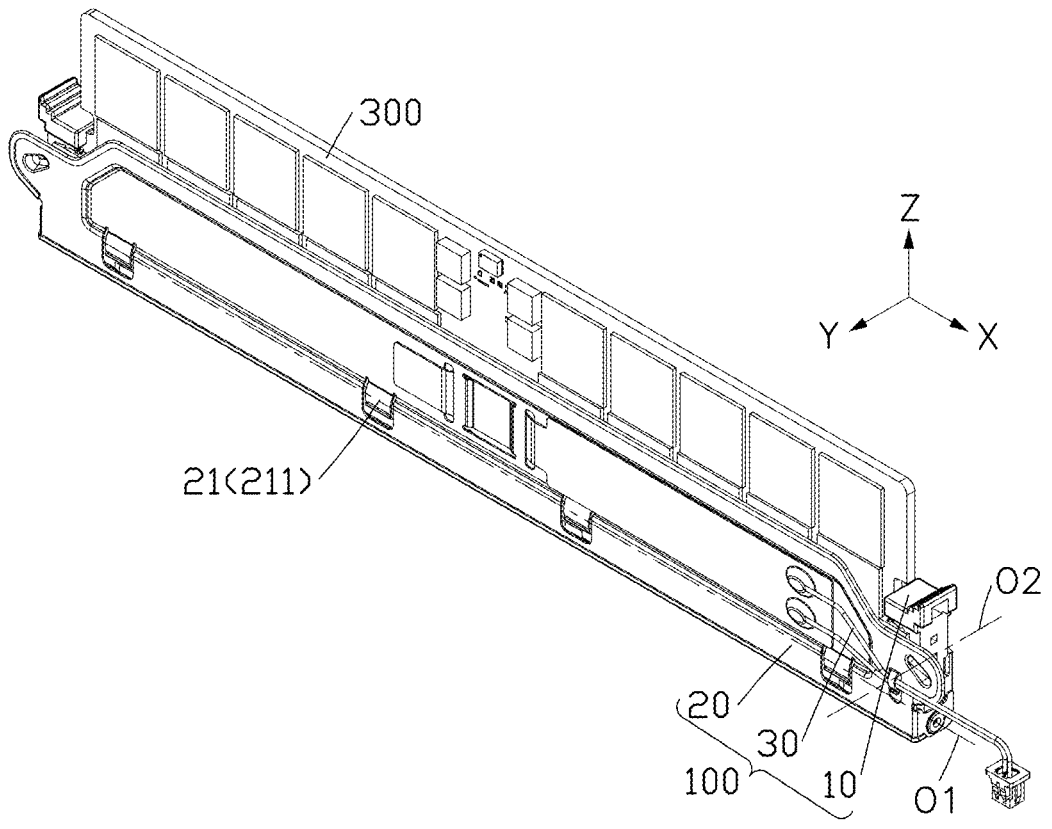
FIG. 3 is a diagrammatic view of a fixing assembly and a memory module of the electronic device in FIG. 1.
Figure 4:
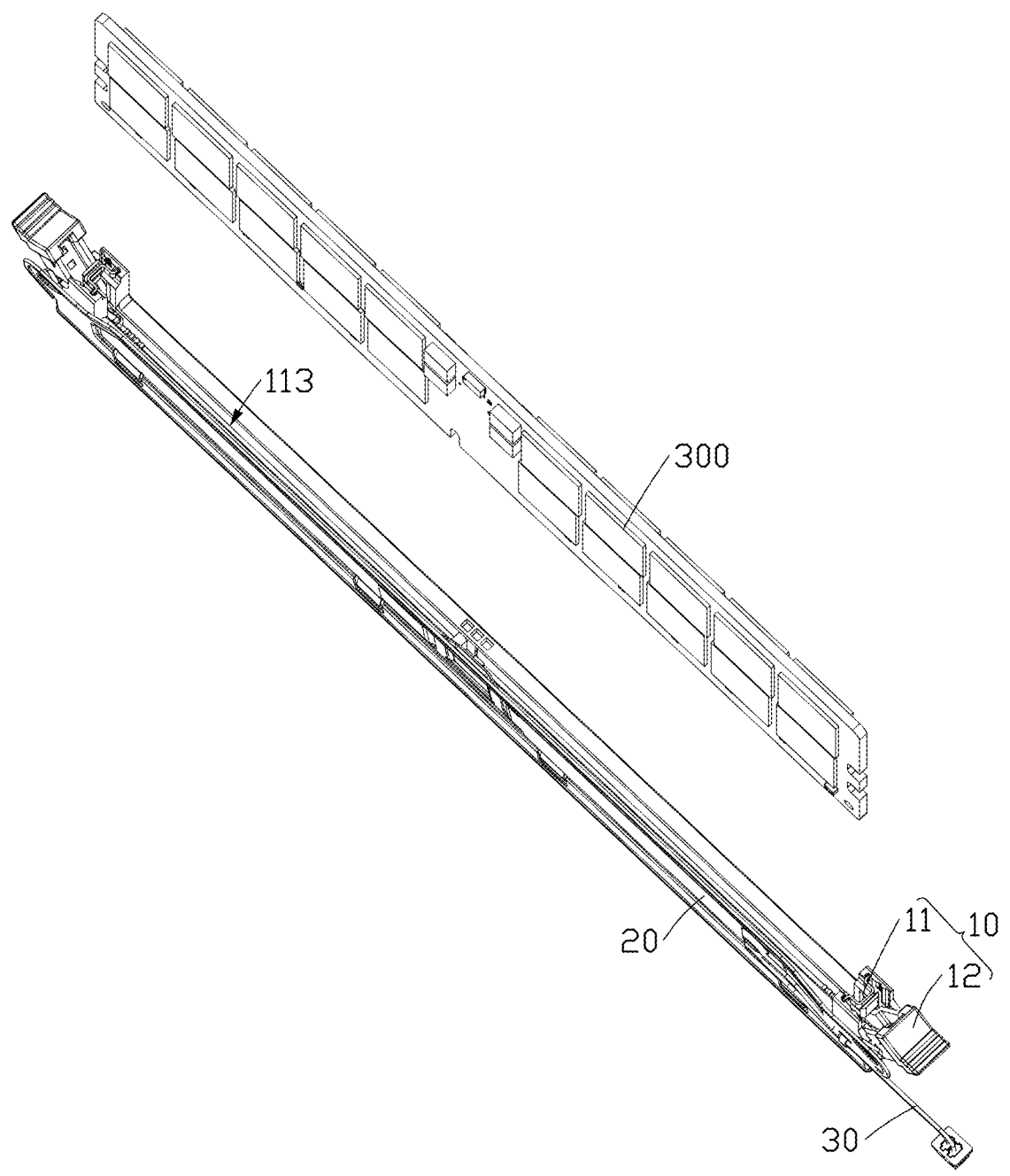
FIG. 4 is an exploded view of the fixing assembly and the memory module in FIG. 3.
Figure 5:
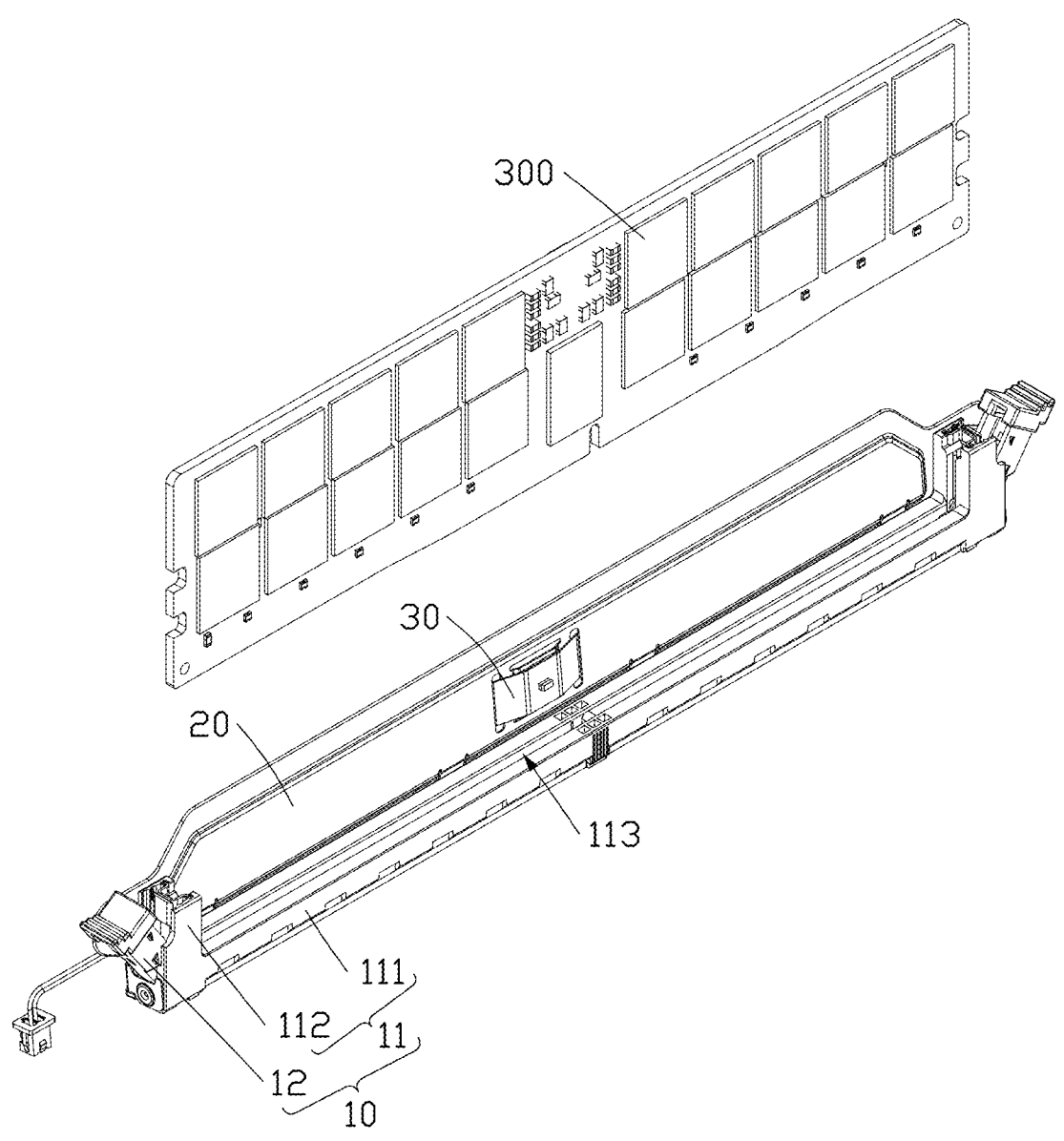
FIG. 5 is similar to FIG. 4, but showing the fixing assembly viewed from a different angle.

Referring to FIGS. 3, 4, and 5, each fixing assembly 100 includes a base 10, a bracket 20, and a functional component 30. A coordinate system is defined in the figures. X-axis represents the length direction of the base 10, Y-axis is perpendicular to the X-axis in the horizontal plane, and Z-axis is perpendicular to the plane formed by the X-axis and Y-axis. The insertion and removal direction of the memory module 300 is parallel to the Z-axis.

The base 10 is provided with a receiving slot 113, in which the memory module 300 can be mounted, thereby enabling the memory module 300 to be connected to the fixing assembly 100. The bracket 20 is rotatably connected to the base 10, with the rotational axis O1 of the bracket 20 being parallel to the X-axis. The bracket 20 has a first state and a second state. When the bracket 20 is in the first state, the bracket 20 is substantially vertical. When the bracket 20 rotates away from the base 10, the bracket 20 switches to the second state, in which the bracket 20 is inclined relative to the Z-axis. The bracket 20 includes a resilient structure 21, which is configured to elastically deform when the bracket 20 rotates from the first state to the second state. Then, the rebounding force of the resilient structure 21 can drive the bracket 20 to return from the second state to the first state. The functional component 30 is arranged on the bracket 20. When the bracket 20 is in the first state, the functional component 30 is in contact with the memory module 300, thereby enabling the functional component 30 to perform operations such as detecting the temperature of the memory module 300, and heating or cooling the memory module 300. When the bracket 20 is in the second state, the functional component 30 is separated from the memory module 300, thereby preventing the memory module 300 from scratching the functional component 30 during the insertion and removal of the memory module 300. Unless otherwise specified, following descriptions of the fixing assembly 100 assume that the bracket 20 is in the first state.

The functional component 30 is arranged on the bracket 20, and the resilient structure 21 maintains the bracket 20 in the first state, thereby allowing the functional component 30 to in directly contact with the memory module 300. When it is necessary to insert or remove the memory module 300 from the electronic device 1, the bracket 20 can be rotated to the second state, thereby facilitating the insertion or removal of the memory module 300. After the memory module 300 is installed in the receiving slot 113, the resilient structure 21 returns the bracket 20 to the first state, thereby allowing the functional component 30 to in contact with the memory module 300. The process of the functional component 30 getting in contact with or separating from the memory module 300 is simple and convenient.

Figure 6:
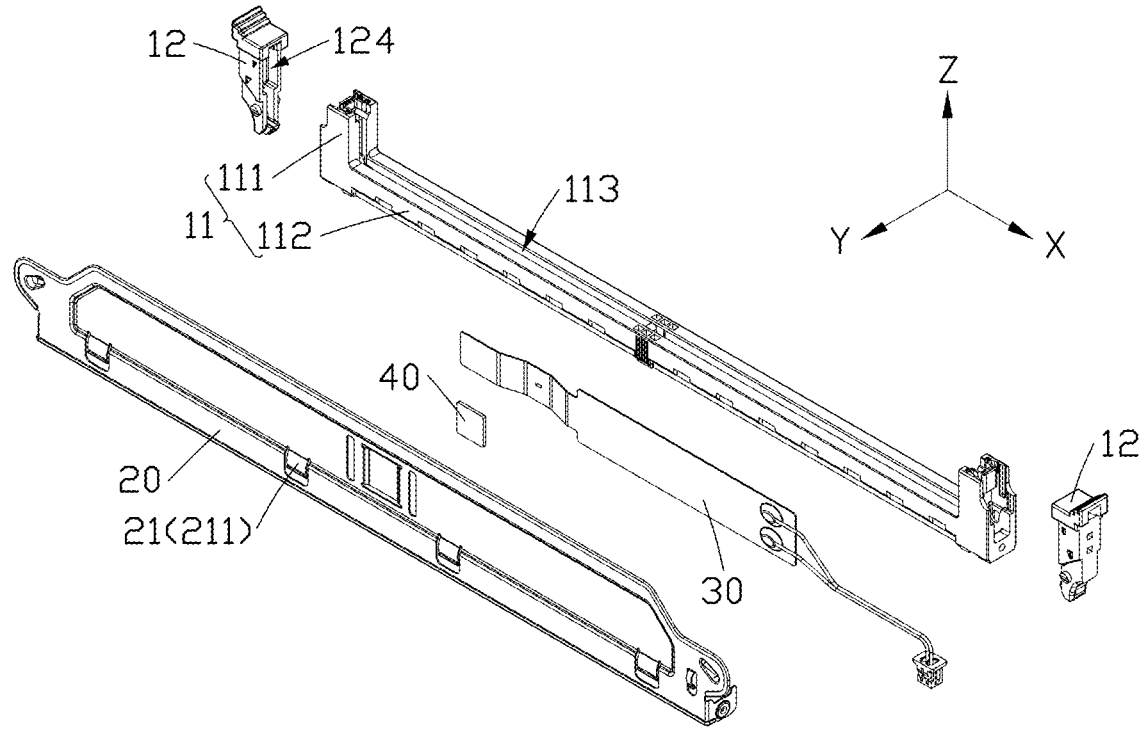
FIG. 6 is another exploded view of the fixing assembly in FIG. 3.

Referring to FIGS. 5 and 6, in some embodiments, the base 10 includes a socket 11 and two securing portions 12. The socket 11 extends along the X-axis, with the receiving slot 113 being positioned in the socket 11. The two securing portions 12 are spaced apart from each other along the X-axis and positioned at opposite ends of the socket 11. The securing portions 12 are rotatably connected to the socket 11, with the rotational axis O2 of each one of the securing portions 12 being perpendicular to the extending direction of the bracket 20 and the insertion direction of the memory module 300. That is, the rotational axis O2 of the securing portions 12 extends along the Y-axis.

The securing portions 12 have a fixed state and an unlocked state. When the securing portions 12 are in the fixed state, the securing portions 12 extend substantially along the Z-axis, thereby limiting the position of the memory module 300. When the securing portions 12 rotate away from each other, the securing portions 12 may switch from the fixed state to the unlocked state, thereby releasing the memory module 300. Unless otherwise specified, the following descriptions of the fixing assembly 100 assume that the securing portions 12 are in the fixed state.

Figure 7:
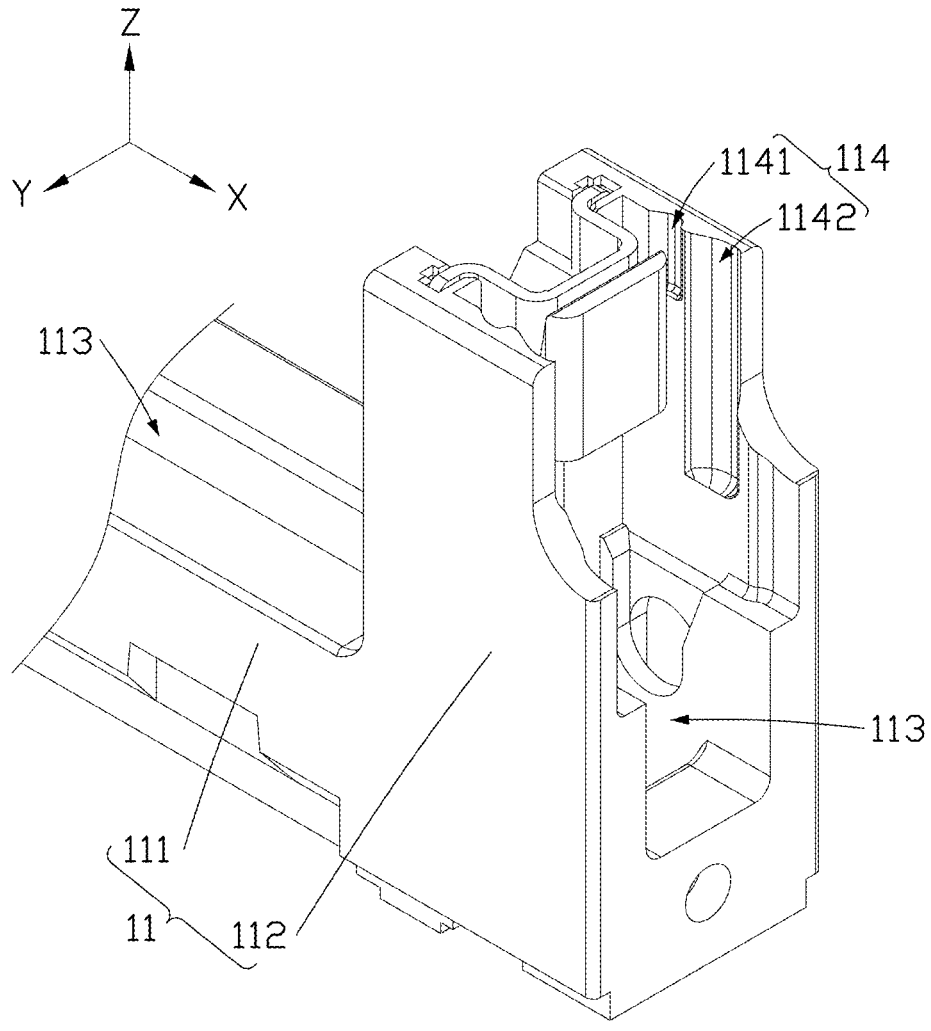
FIG. 7 is a diagrammatic view of a portion of a socket of the fixing assembly in FIG. 3.

Referring to FIGS. 6 and 7, the socket 11 includes a plug portion 111 and two connecting portions 112. The plug portion 111 extends along the X-axis. The two connecting portions 112 are connected to opposite ends of the plug portion 111 along the X-axis. The receiving slot 113 is positioned in the plug portion 111 and the two connecting portions 112. The securing portions 12 are rotatably connected to the connecting portions 112, and the bracket 20 is rotatably connected to the two connecting portions 112. Along the Z-axis, a width of the plug portion 111 is smaller than the height of the connecting portions 112, such that the socket 11 is substantially U-shaped.

Figure 8:
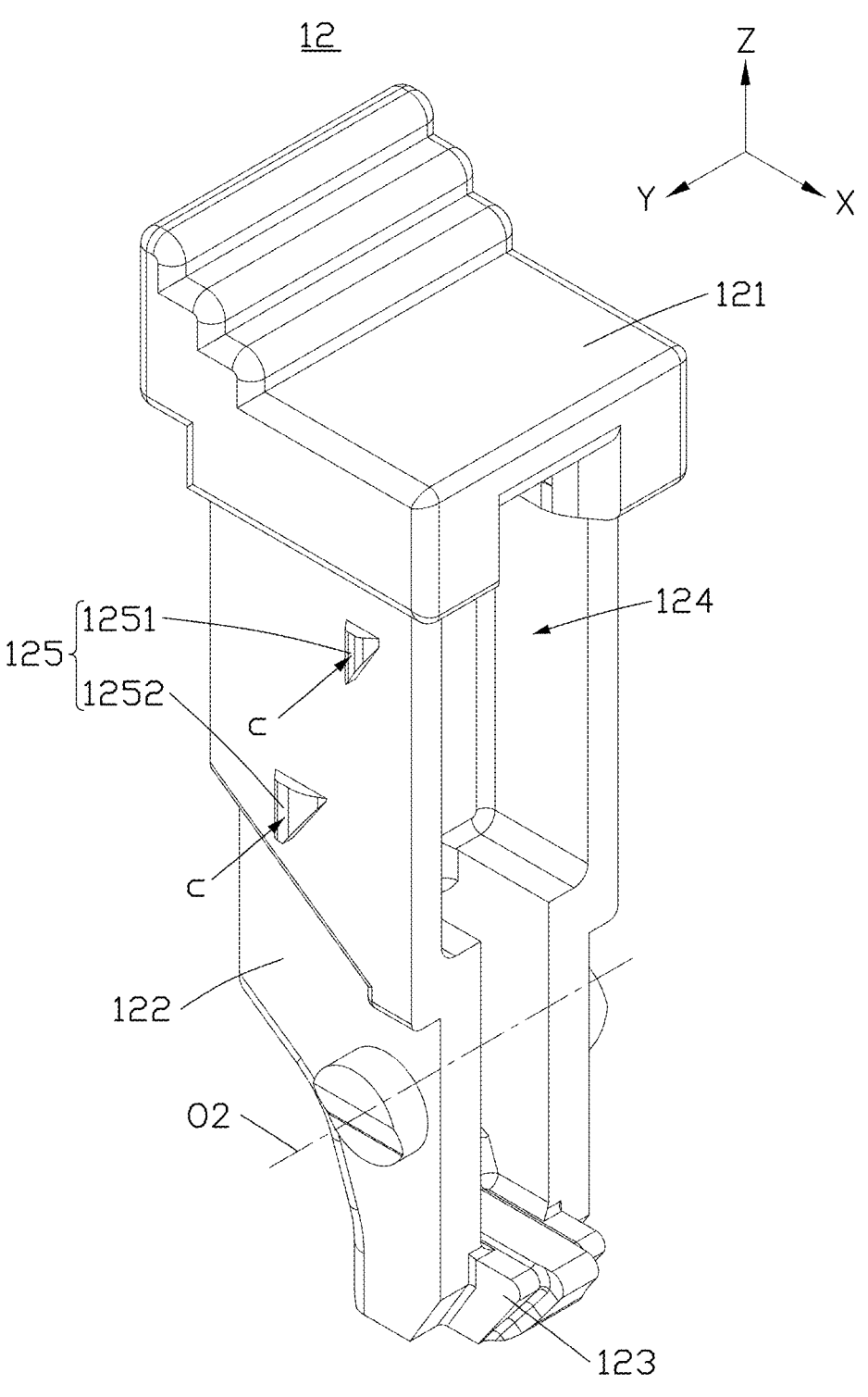
FIG. 8 is a diagrammatic view of a securing portion of the fixing assembly in FIG. 3.

Referring to FIGS. 7 and 8, in some embodiments, the securing portions 12 are positioned in the receiving slot 113 formed by the connecting portions 112. Each securing portion 12 is provided with a locking structure 125, and an inner wall of the receiving slot 113 is provided with a locking groove 114. The locking structure 125 is positioned within the locking groove 114, thereby limiting the position of the securing portions 12. By providing the locking structure 125 and the locking groove 114, the securing portions 12 can be stably maintained in the fixed state, thereby limiting the position of the memory module 300.

In some embodiments, the locking structure 125 includes a first locking block 1251 and a second locking block 1252, which are spaced apart from each other. Along the Z-axis, the first locking block 1251 is positioned above the second locking block 1252. Along the X-axis, the first locking block 1251 is closer to the other securing portion 12 than the second locking block 1252. The locking groove 114 includes a first portion 1141 and a second portion 1142, the first portion 1141 is closer to the plug portion 111 than the second portion 1142 along the X-axis. The first locking block 1251 is positioned in the first portion 1141, and the second locking block 1252 is positioned in the second portion 1142. By positioning the first locking block 1251 in the first portion 1141 and the second locking block 1252 in the second portion 1142, the position of the securing portions 12 can be limited, thereby enhancing the stability of the securing portions 12. When the securing portions 12 rotate to the unlocked state, the first locking block 1251 disengages from the first portion 1141, and the second locking block 1252 disengages from the second portion 1142.

In at least one embodiment, there are two first locking blocks 1251 and two second locking blocks 1252, the two first locking blocks 1251 are positioned on opposite sides of the securing portions 12 along the Y-axis. The two second locking blocks 1252 are positioned on opposite sides of the securing portions 12 along the Y-axis. There are also two first portions 1141 and two second portions 1142, the two first portions 1141 are spaced apart along the Y-axis on an inner wall of the receiving slot 113. The two second portions 1142 are spaced apart along the Y-axis on an inner wall of the receiving slot 113.

Referring to FIG. 8, in some embodiments, a height of the first locking block 1251 and the second locking block 1252 gradually decreases in a direction toward the other securing portion 12. The height of the first locking block 1251 and the second locking block 1252 is parallel to the insertion direction of the memory module 300, i.e., parallel to the Z-axis.

When the securing portions 12 move from the unlocked state to the fixed state, the smaller height of the first locking block 1251 facilitates the insertion of the first locking block 1251 into the first portion 1141, the smaller height of the second locking block 1252 on the side closer to the plug portion 111 facilitates the insertion of the second locking block 1252 into the second portion 1142.

When the securing portions 12 are in the fixed state, the larger height of the first locking block 1251 and the second locking block 1252 on the side farther from the plug portion 111 reduces the likelihood of accidental rotation of the securing portions 12, thereby preventing the first locking block 1251 from disengaging from the first portion 1141 and the second locking block 1252 from disengaging from the second portion 1142.

In some embodiments, along the length direction, a thickness of the first locking block 1251 increases in a direction toward a center C of the first locking block 1251, a thickness of the second locking block 1252 increases in a direction toward a center C of the second locking block 1252, and a thickness direction of each of the first locking block 1251 and the second locking block 1252 is parallel to the rotational axis O2 of the two securing portions 12

The smaller thickness on the sides of the first locking block 1251 and the second locking block 1252 facilitates insertion into or removal from the corresponding first portion 1141 and second portion 1142. The larger thickness in the center C enhances the stability of the first locking block 1251 and the second locking block 1252, thereby reducing the likelihood of accidental rotation of the securing portions 12, and preventing the first locking block 1251 from disengaging from the first portion 1141 and the second locking block 1252 from disengaging from the second portion 1142.

In some embodiments, along the Y-axis, a slope on a side of the first locking block 1251 close to the plug portion is smaller than a slope of the first locking block farther from the plug portion 111. A slope on a side of the second locking block 1252 closer to the plug portion 11 is smaller than a slope on a side farther from the plug portion 111. This facilitates the insertion of the first locking block 1251 and the second locking block 1252 into the corresponding first portion 1141 and second portion 1142, and enhances the stability of the first locking block 1251 and the second locking block 1252 in the corresponding first portion 1141 and second portion 1142.

Referring to FIGS. 6, 7 and 8, in some embodiments, a snap slot 124 is provided on a side of the securing portions 12 facing each other, with the memory module 300 being partially positioned within the snap slot 124, thereby limiting the position of the memory module 300.

The securing portions 12 include a handle 121, a limiting block 122, and a pushing block 123. The handle 121 is fixed above the limiting block 122, the snap slot 124 is positioned between the handle 121 and the limiting block 122, and the locking structure 125 is positioned on opposite sides of the limiting block 122. The limiting block 122 is rotatably connected to the connecting portions 112. The pushing block 123 is arranged at the lower end of the limiting block 122.

When the securing portions 12 are in the fixed state, the memory module 300 is at least partially positioned in the snap slot 124, with the pushing block 123 being positioned at the bottom of the memory module 300. When the securing portions 12 switch from the fixed state to the unlocked state, the pushing block 123 rotates and lifts the memory module 300, thereby facilitating the removal of the memory module 300.

When inserting the memory module 300 into the electronic device 1, the bottom of the memory module 300 pushes the pushing block 123, thereby causing the securing portions 12 to rotate from the unlocked state to the fixed state to secure the memory module 300. The process of securing the memory module 300 with the securing portions 12 is simple and convenient.

Figure 9:
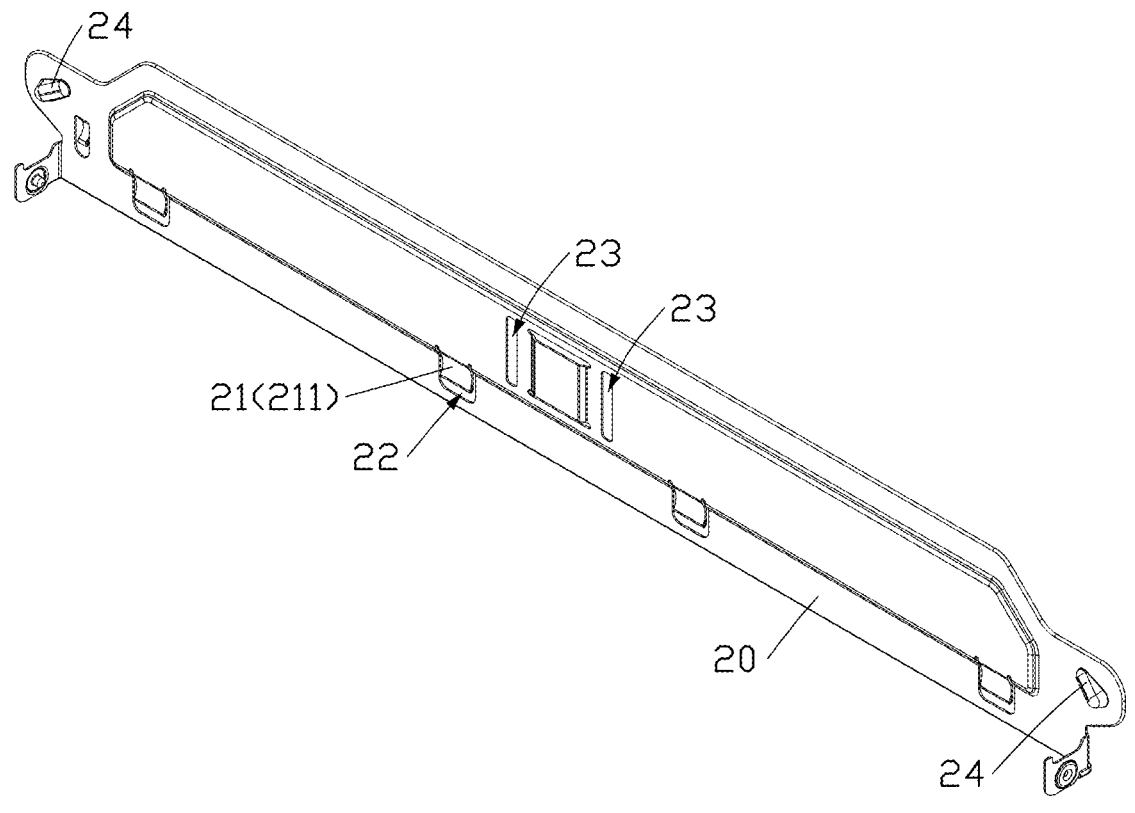
FIG. 9 is a diagrammatic view of a bracket of the fixing assembly in FIG. 3.
Figure 10:
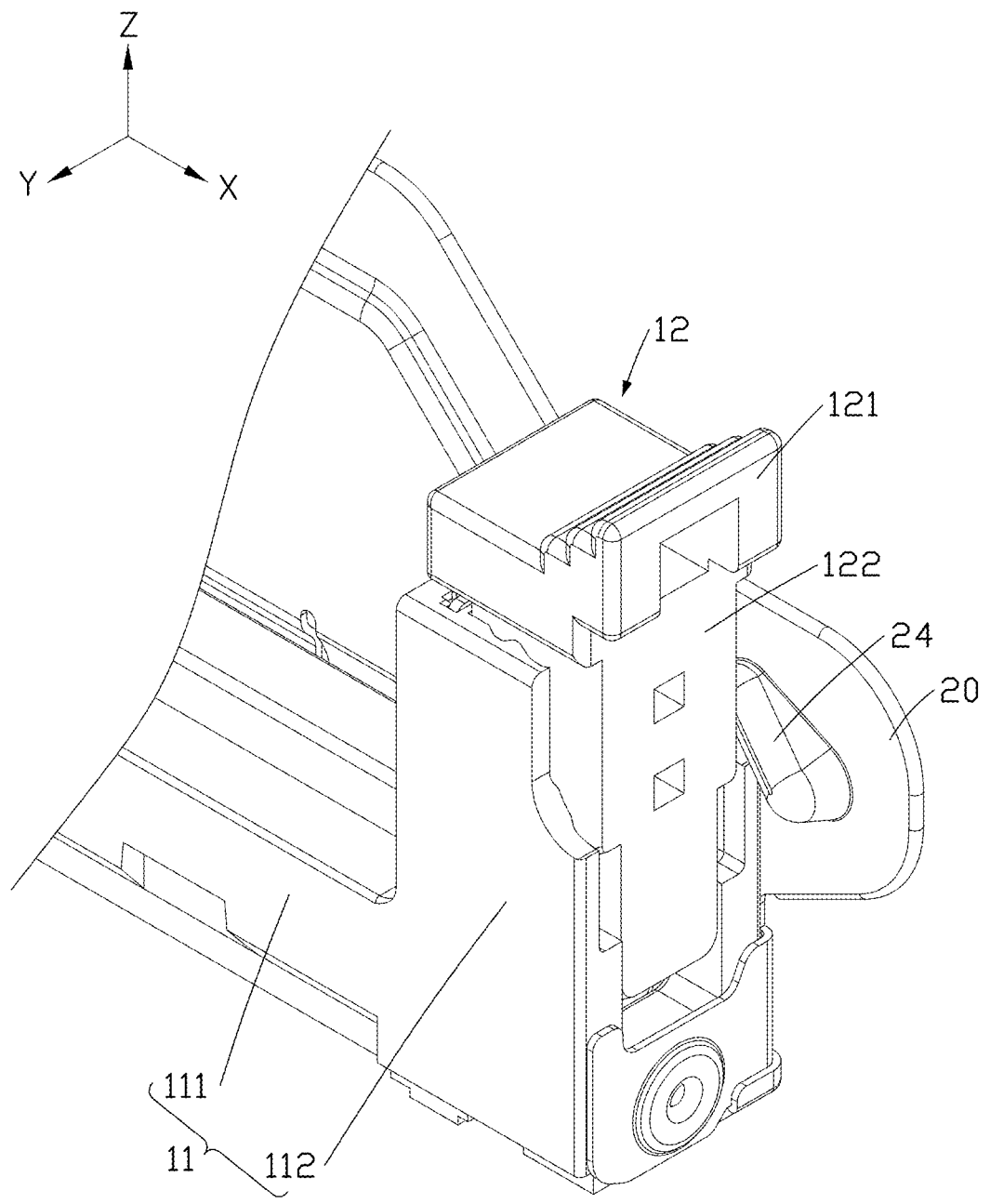
FIG. 10 is a diagrammatic view of a portion of the fixing assembly in FIG. 3.
Figure 11:
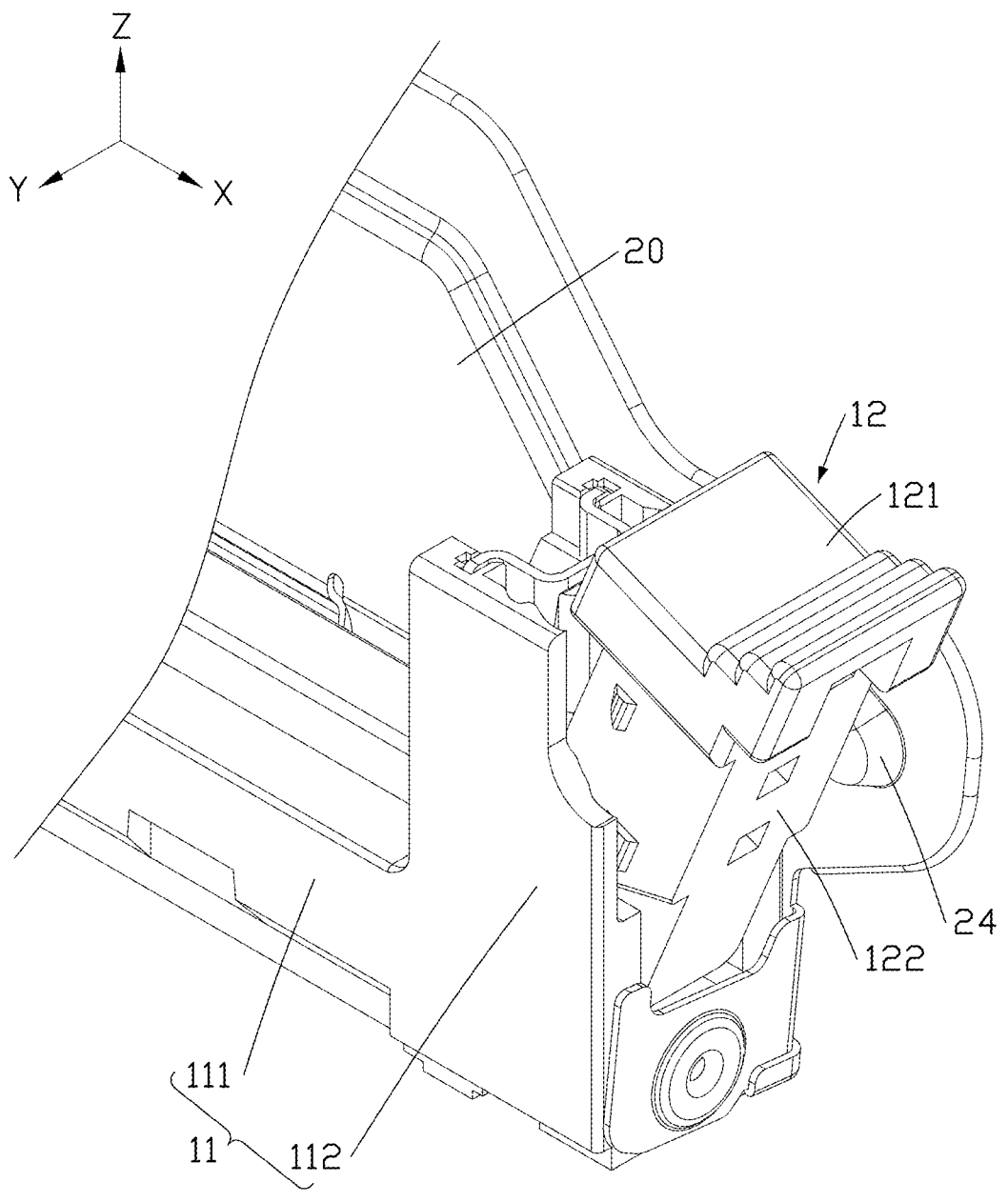
FIG. 11 is a diagrammatic view of a portion of the fixing assembly in FIG. 3, with the securing portion in an unlocked state and the bracket in a second state.

Referring to FIGS. 9, 10, and 11, in some embodiments, the securing portions 12 are configured to release the memory module 300 when the securing portions 12 rotate away from each other and to drive the bracket 20 to rotate away from the socket 11.

When the memory module 300 is released, it is often necessary to remove the memory module 300. When the securing portions 12 move to the unlocked state, the securing portions 12 also drive the bracket 20 to move to the second state, thereby causing the functional component 30 to separate from the memory module 300, which facilitates the removal of the memory module 300.

Multiple effects can be achieved by rotating the securing portions 12, including unlocking the memory module 300, lifting the memory module 300, and driving the bracket 20 to move to the second state, thereby enhancing operational convenience.

In some embodiments, two guiding blocks 24 are provided on a side of the bracket 20 close to the base 10. The two guiding blocks 24 are positioned adjacent to the two securing portions 12. Each guiding block 24 is in contact with the corresponding securing portion 12. The thickness of the guiding blocks 24 gradually increases in the direction away from each other, with the thickness of the guiding blocks 24 being parallel to the rotational axis O2 of the securing portions 12, i.e., parallel to the Y-axis.

As the securing portions 12 rotate from the locked state to the unlocked state, the securing portions 12 push against the guiding blocks 24. Due to the increasing thickness of the guiding blocks 24, the bracket 20 gradually rotates away from the base 10, thereby transitioning the bracket 20 from the first state to the second state. The process of switching the bracket 20 from the first state to the second state is simple and convenient.

In some embodiments, the guiding blocks 24 are inclined along the direction away from each other. The first locking block 1251 and the second locking block 1252 are spaced apart from each other, so that the guiding blocks 24 do not interfere with the first locking block 1251 and the second locking block 1252, while the guiding blocks 24 can maintain an optimal length along the Z-axis. This reduces the likelihood of scratching the limiting block 122 when the guiding blocks 24 are in contact with the securing portions 12.

The bracket 20 has an elongated shape and a large size to facilitate the installation of the functional component 30. Two ends of the bracket 20 are rotatably connected to the two connecting portions 112 of the base 10, thereby allowing the bracket 20 to switch between the first state and the second state.

Figure 12:
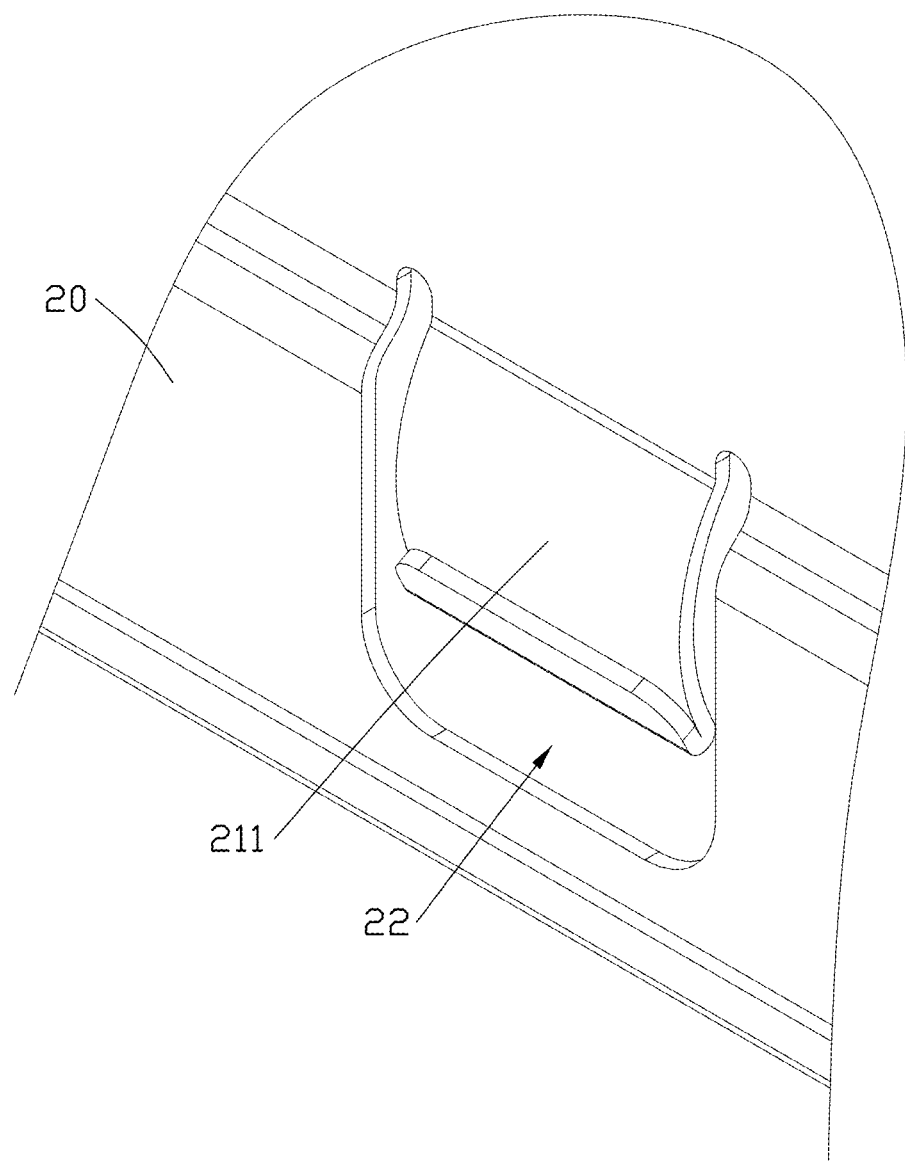
FIG. 12 is a diagrammatic view of a portion of the bracket in FIG. 3.

Referring to FIGS. 9 and 12, in some embodiments, the bracket 20 is provided with a plurality of avoidance slots 22, and the resilient structure 21 includes a spring piece 211 positioned in each of the plurality of avoidance slots 22. The spring piece 211 is arranged in an arc shape, with one end connected to a wall of the plurality of avoidance slots 22 and the other end in contact with the base 10.

When the bracket 20 is in the second state, the spring piece 211 is elastically deformed, and the rebounding force of the spring piece 211 rotates the bracket 20 to the first state when the securing portions 12 are in the fixed state, thereby allowing the functional component 30 to contact the memory module 300.

In at least one embodiment, the plurality of avoidance slots 22 are arranged at intervals along the X-axis, with each avoidance slot 22 receiving one spring piece 211.

The spring piece 211 allows the bracket 20 to automatically rebound from the second state to the first state. Since the spring piece 211 and the guiding blocks 24 are both arranged on the bracket 20, the structure of the base 10 has a very small change. Thus, the fixing assembly 100 can be applied in various product without the need for additional production, thereby reducing costs.

The bracket 20 can be maintained in the first state by the spring piece 211 in a moderate manner, thereby reducing the likelihood of excessive elastic force from the spring piece 211 that may cause the bracket 20 to squeeze the functional component 30 or the memory module 300 when returning from the second state to the first state. That is, damages to the functional component 30 or the memory module 300 can be reduced. It also reduces the likelihood of insufficient contact between the functional component 30 and the memory module 300 due to insufficient elastic force from the spring piece 211.

In some embodiments, the spring piece 211 is arc-shaped, and a lower end of the spring piece 211 is folded upward, such that the lower end of the spring piece 211 has a double-layered structure.

In other embodiments, the resilient structure 21 may be a torsion spring, which is positioned at both ends of the bracket 20. The torsion spring may have a long service life.

Referring to FIGS. 6 and 9, in some embodiments, the bracket 20 is provided with two through-slots 23, which are spaced apart from each other along the X-axis. The functional component 30 is partially positioned on the side of the bracket 20 away from the base 10, with the functional component 30 passing through the two through-slots 23 so that another portion of the functional component 30 is positioned on the side of the bracket 20 close to the base 10. The functional component 30 positioned on the side of the bracket 20 close to the base 10 can be in contact with the memory module 300.

Since the functional component 30 requires connection to wirings (not shown), the arrangement of the two through-slots 23 allows most of the functional component 30 to be positioned on the side of the bracket 20 away from the base 10, thereby increasing the installation space for the functional component 30. The functional component 30 passing through the through-slots 23 also facilitates the positioning of the functional component 30.

In some embodiments, the portion of the bracket 20 between the two through-slots 23 protrudes toward the base 10, thereby enhancing the contact between the functional component 30 and the memory module 300.

In some embodiments, the fixing assembly 100 further includes a flexible body 40 positioned on the side of the bracket 20 close to the base 10. The flexible body 40 is located between the two through-slots 23. The functional component 30 is in contact with the side of the flexible body 40 away from the bracket 20, thereby allowing the functional component 30 to attach the memory module 300. Optionally, the flexible body 40 is made of sponge.

In some embodiments, the bracket 20 is also provided with a clip for securing the wirings of the functional component 30.

In some embodiments, the functional component 30 is a temperature sensor that in direct contact with the memory module 300, which can measure the temperature of the memory module 300.

In other embodiments, the functional component 30 is a heating module for heating the memory module 300.

In other embodiments, the functional component 30 is a cooling module for lowering the temperature of the memory module 300.

In some embodiments, the memory module 300 is a DIMM (Dual-Inline-Memory-Modules) memory module. Two opposite ends of the memory module 300 are provided with recesses that engage with the securing portions 12, thereby limiting the position of the memory module 300.

In summary, by providing the bracket 20 rotatably connected to the base 10, the bracket 20 can be in the first state and the second state. By rotating the securing portions 12 to push against the guiding blocks 24, the bracket 20 can switch from the first state to the second state. The resilient structure 21 enables the bracket 20 to switch from the second state back to the first state. The switch of the bracket 20 between the first state and the second state is simple and quick. When the bracket 20 is in the first state, the functional component 30 arranged on the bracket 20 can be in contact with the memory module 300, thereby facilitating operations such as temperature detection, heating, and cooling of the memory module 300. When the bracket 20 is in the second state, the functional component 30 is separated from the memory module 300, thereby facilitating the insertion and removal of the memory module 300.

The embodiments shown and described above are only examples. Many details are often found in the art such as the other features of the electronic device 1. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A fixing assembly configured for a memory module, the fixing assembly comprising:
   a base defining a receiving slot for receiving the memory module;
   a bracket rotatably connected to the base; and
   a functional component arranged on the bracket;
   wherein a rotational axis of the bracket is parallel to a length direction of the base, the bracket comprises a resilient structure, the resilient structure is configured to elastically deform when the bracket rotates away from the base and apply a rebounding force toward the base, thereby the functional component is configured to be in contact with the memory module;
   wherein the bracket defines a plurality of avoidance slots, one end of the resilient structure is disposed within each of the plurality of avoidance slots, and another end of the resilient structure is connected to the base.

2. The fixing assembly of claim 1, wherein the base comprises a socket and two securing portions, the receiving slot is defined on the socket defines, the two securing portions are spaced apart from each other and rotatably connected to opposite ends of the socket along the length direction of the base, a rotational axis of each one of the securing portions is perpendicular to the length direction; the two securing portions are configured to limit a position of the memory module.

3. The fixing assembly of claim 2, wherein the bracket further comprises two guiding blocks, and the two guiding blocks are respectively connected to the two securing portions.

4. The fixing assembly of claim 2, wherein the two securing portions are disposed in the receiving slot, each of the two securing portions comprises a locking structure, an inner wall of the receiving slot defines a locking groove, and the locking structure is disposed in the locking groove.

5. The fixing assembly of claim 4, wherein the locking structure comprises a first locking block and a second locking block spaced apart from the first locking block, the locking groove comprises a first portion and a second portion, the first locking block is disposed in the first portion, and the second locking block is disposed in the second portion.

6. The fixing assembly of claim 5, wherein a height of the first locking block of one of the two securing portions decreases in a direction toward another one of the two securing portions, a height of the second locking block of one of the two securing portions decreases in a direction toward another one of the two securing portions, the heights of the first and the second locking blocks are measured in a height direction that is parallel to an insertion direction of the memory module, along the length direction, a thickness of the first locking block increases in a direction toward a center of the first locking block, a thickness of the second locking block increases in a direction toward a center of the second locking block, and the thicknesses of the first and the second locking blocks are measured in a thickness direction that is parallel to the rotational axis of the two securing portions.

7. The fixing assembly of claim 1, wherein the functional component is a temperature sensor configured to detect a temperature of the memory module.

8. A motherboard, comprising:
   a circuit board, and a fixing assembly arranged on the circuit board,
   wherein the fixing assembly comprises:
   a base defining a receiving slot for receiving the memory module;
   a bracket rotatably connected to the base; and
   a functional component arranged on the bracket;
   wherein a rotational axis of the bracket is parallel to a length direction of the base, the bracket comprises a resilient structure, the resilient structure is configured to elastically deform when the bracket rotates away from the base and apply a rebounding force toward the base, thereby the functional component is configured to be in contact with the memory module;

wherein the bracket defines a plurality of avoidance slots, one end of the resilient structure is disposed within each of the plurality of avoidance slots, and another end of the resilient structure is connected to the base.

9. The motherboard of claim 8, wherein the base comprises a socket and two securing portions, the receiving slot is defined on the socket defines, the two securing portions are spaced apart from each other and rotatably connected to opposite ends of the socket along the length direction of the base, a rotational axis of each one of the securing portions is perpendicular to the length direction; the two securing portions are configured to limit a position of the memory module.

10. The motherboard of claim 9, wherein the bracket further comprises two guiding blocks, and the two guiding blocks are respectively connected to the two securing portions.

11. The motherboard of claim 9, wherein the two securing portions are disposed in the receiving slot, each of the two securing portions comprises a locking structure, an inner wall of the receiving slot defines a locking groove, and the locking structure is disposed in the locking groove.

12. The motherboard of claim 11, wherein the locking structure comprises a first locking block and a second locking block spaced apart from the first locking block, the locking groove comprises a first portion and a second portion, the first locking block is disposed in the first portion, and the second locking block is disposed in the second portion.

13. The motherboard of claim 12, wherein a height of the first locking block of one of the two securing portions decreases in a direction toward another one of the two securing portions, a height of the second locking block of one of the two securing portions decreases in a direction toward another one of the two securing portions, the heights of the first and the second locking blocks are measured in a height direction that is parallel to an insertion direction of the memory module, along the length direction, a thickness of the first locking block increases in a direction toward a center of the first locking block, a thickness of the second locking block increases in a direction toward a center of the second locking block, and the thicknesses of the first and the second locking blocks are measured in a thickness direction that is parallel to the rotational axis of the two securing portions.

14. The motherboard of claim 8, wherein the functional component is a temperature sensor configured to detect a temperature of the memory module.

15. An electronic device comprising a motherboard, wherein the motherboard comprises:

a circuit board, and a fixing assembly arranged on the circuit board, the fixing assembly comprises: a base defining a receiving slot for receiving the memory module;

a bracket rotatably connected to the base; and a functional component arranged on the bracket;

wherein a rotational axis of the bracket is parallel to a length direction of the base, the bracket comprises a resilient structure, the resilient structure is configured to elastically deform when the bracket rotates away from the base and apply a rebounding force toward the base, thereby the functional component is configured to be in contact with the memory module;

wherein the bracket defines a plurality of avoidance slots, one end of the resilient structure is disposed within each of the plurality of avoidance slots, and another end of the resilient structure is connected to the base.

16. The motherboard of claim 15, wherein the base comprises a socket and two securing portions, the receiving slot is defined on the socket defines, the two securing portions are spaced apart from each other and rotatably connected to opposite ends of the socket along the length direction of the base, a rotational axis of each one of the securing portions is perpendicular to the length direction; the two securing portions are configured to limit a position of the memory module.

17. The motherboard of claim 16, wherein the bracket further comprises two guiding blocks, and the two guiding blocks are respectively connected to the two securing portions.

* * * * *